(12) United States Patent
Kameyama et al.

(10) Patent No.: US 8,938,019 B2
(45) Date of Patent: Jan. 20, 2015

(54) DATA TRANSMITTING DEVICE AND DATA TRANSMITTING/RECEIVING METHOD

(75) Inventors: Hiroaki Kameyama, Kawasaki (JP); Hidenori Gohhara, Kobe (JP)

(73) Assignees: Fujitsu Limited, Kawasaki (JP); Fujitsu Ten Limited, Kobe-Shi (JP)

( * ) Notice: Subject to any disclaimer, the term of this patent is extended or adjusted under 35 U.S.C. 154(b) by 269 days.

(21) Appl. No.: 13/429,888

(22) Filed: Mar. 26, 2012

(65) Prior Publication Data
US 2012/0183094 A1    Jul. 19, 2012

Related U.S. Application Data

(63) Continuation of application No. PCT/JP2009/067098, filed on Sep. 30, 2009.

(51) Int. Cl.
*H04B 7/02* (2006.01)
*H04L 1/00* (2006.01)

(52) U.S. Cl.
CPC ............ *H04L 1/0084* (2013.01); *H04L 1/0041* (2013.01)
USPC ....................................... 375/267

(58) Field of Classification Search
CPC ... H04L 1/0057; H04L 1/0009; H04L 1/0041; H04L 1/0002; H04L 1/1816; H04L 12/1877; H04L 1/008; H03M 13/2939; H03M 13/13
USPC ......... 375/295, 296, 316, 340, 259, 260, 267; 714/699, 746, 786, 752
See application file for complete search history.

(56) References Cited

U.S. PATENT DOCUMENTS

| | | | |
|---|---|---|---|
| 5,608,738 A * | 3/1997 | Matsushita | 714/752 |
| 6,061,820 A | 5/2000 | Nakakita et al. | |
| 6,145,109 A * | 11/2000 | Schuster et al. | 714/752 |
| 6,678,855 B1 | 1/2004 | Gemmell | |
| 7,389,463 B2 | 6/2008 | Ramaswamy et al. | |
| 2002/0054608 A1 | 5/2002 | Wan et al. | |
| 2004/0260863 A1 * | 12/2004 | Gemmell | 711/100 |

FOREIGN PATENT DOCUMENTS

| | | |
|---|---|---|
| EP | 0 588 307 B1 | 12/1999 |
| EP | 1 944 898 A2 | 7/2008 |

(Continued)

OTHER PUBLICATIONS

Japanese Office Action mailed Jul. 23, 2013 in corresponding Japanese Application No. 2011-534011.

(Continued)

*Primary Examiner* — Vineeta Panwalkar
(74) *Attorney, Agent, or Firm* — Staas & Hasley LLP

(57) ABSTRACT

A data transmitting device includes a coded-data generating unit and a data transmitting unit. The coded-data generating unit divides transmission data by a predetermined number in accordance with a data size of the transmission data and then adds a redundant code to the divided transmission data at a predetermined ratio or adds the redundant code to the transmission data at the predetermined ratio so as to generate multiple blocks of coded data. The data transmitting unit groups together the multiple blocks of coded data generated by the coded-data generating unit into a number of blocks that are inserted into a transmission data block, which has a predetermined size, and then transmits the transmission data block.

9 Claims, 16 Drawing Sheets

(56) References Cited

FOREIGN PATENT DOCUMENTS

| | | |
|---|---|---|
| JP | 6-188862 | 7/1994 |
| JP | 8-186570 | 7/1996 |
| JP | 11-145969 | 5/1999 |
| JP | 2005-512352 | 4/2005 |
| JP | 2005-136719 | 5/2005 |
| JP | 2005-223433 | 8/2005 |
| JP | 2005-347927 | 12/2005 |
| JP | 2007-74440 | 3/2007 |
| JP | 2008-42534 | 2/2008 |

OTHER PUBLICATIONS

Toshiaki Uemukai, et al. "A content delivery method for efficient IP multicast transmission on a cellular phone network" KDDI R&D Laboratories Inc., Sep. 2005, 8 pages.

International Search Report for PCT/JP2009/067098 mailed Dec. 15, 2009.

Extended European Search Report mailed Sep. 5, 2014 for corresponding European Patent Application No. 09850065.5.

* cited by examiner

FIG.6
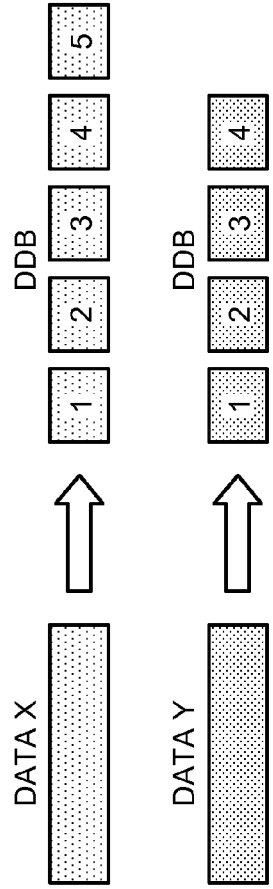
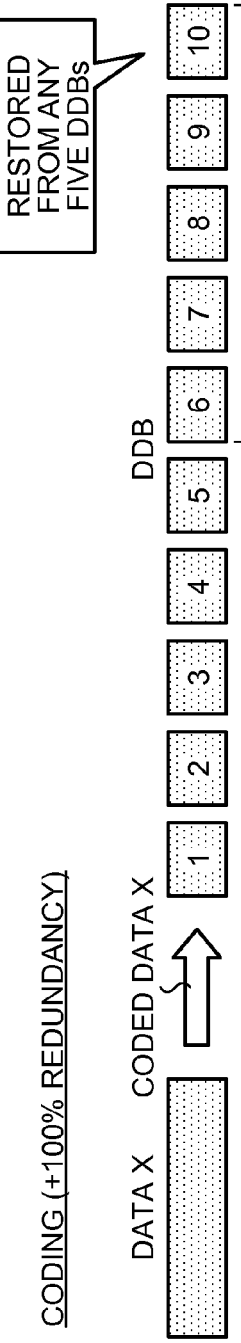
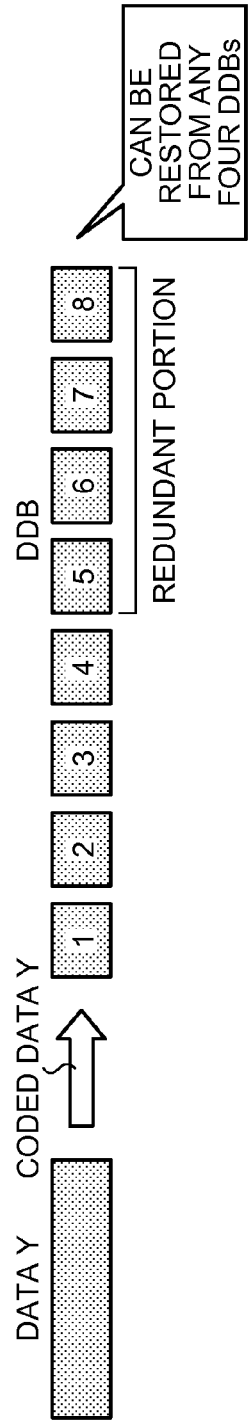

Related Art

DATA TRANSMITTING DEVICE AND DATA TRANSMITTING/RECEIVING METHOD

CROSS-REFERENCE TO RELATED APPLICATION

This application is a continuation of International Application No. PCT/JP2009/067098, filed on Sep. 30, 2009, the entire contents of which are incorporated herein by reference.

FIELD

The embodiments discussed herein are directed to a data transmitting device, a data generation program, and a data transmitting/receiving method.

BACKGROUND

The reception condition of a receiver often becomes unstable due to the environment, or the like, during digital broadcasting; therefore, a transmission system called a data carousel system (DSM-CC: Digital Storage Media Command and Control) is used for transmitting data, such as digital content. With a data carousel system, the same data is repeatedly transmitted during a predetermined period of time in order to improve the accuracy with which a receiver side receives the data.

A brief explanation is given of the data carousel system. A transmitter divides data into variable-length transmission data blocks, which are called DDBs (Download Data Block), and transmits them as a unit, called a TS (Transport Stream), to a receiver. The receiver side reconfigures the DDBs from the TS, which has been received from the transmitter, and arranges the configured DDBs in order so that the original data is restored.

For example, if the original data is divided into 10 DDBs (d1, d2, d3, . . . , d10), the transmitter sequentially transmits the DDBs from d1 to d10. Then, if a repetition time period specified as a data transmission period has not been exceeded, the transmitter retransmits the DDBs from d1 to d10, starting from d1. If the receiver has received the DDBs that were received from the transmitter during the first transmission except for d1, the receiver receives d1 out of the DDBs that are received from the transmitter during the second transmission so that the original data can be restored. The data transmission from the transmitter to the receiver continues during the above-described repetition time period. Thus, even if the receiver is not able to receive all the DDBs during the second transmission so that the original data is restored, the receiver has the chance to obtain all the DDBs during a third or fourth transmission. Thus, it is possible to improve the accuracy with which the receiver side acquires data.

However, the above-described data carousel system has a problem in that the time when the receiver side receives data may be delayed. For example, if the receiver was able to receive d1 to d9 out of the DDBs that were received from the transmitter during the first turn but was unable to receive d10, the receiver receives d1 to d9 again before receiving d10 during the second turn. Therefore, if the receiver can receive all the DDBs during the second turn and the original data is thus restored, it will take twice as long as it would take in a case where all the DDBs had been received during the first turn. Furthermore, if the receiver can receive all the DDBs during the third turn and the original data is thus restored, it will take three times as long as it would take in a case where all the DDBs had been received during the first turn.

As described above, with the data carousel system, as the reception condition of a receiver becomes worse, the number of times the transmission/reception of data is repeated between the transmitter and the receiver is increased, which results in a further delay in the time when the receiver side receives data.

Moreover, because the DDBs from d1 to d9 have already been received by the receiver, they are DDBs that are no longer necessary for restoring the original content. Nevertheless, with the data carousel system, the DDBs from d1 to d9 are retransmitted from the transmitter to the receiver, which results in a very inefficient process.

There is a disclosed technology in which redundant data, which is obtained by using an error-correcting code, is transmitted in the data carousel system so that data missing from the received data can be restored on a receiver side without having the data repeatedly transmitted (see Japanese Laid-open Patent Publication No. 2008-042534).

However, the technology for transmitting redundant data, which is obtained by using an error-correcting code, by using the data carousel system has a problem in that there is an increase in the unused portion of a transmitted DDB. FIG. 17 is a diagram that illustrates the problem with the conventional technology. For example, for redundancy that uses error-correcting codes, transmission data is divided into n block data that have the same size, and n+k coded data are generated (n and k are integers). For example, FIG. 17 illustrates a case where redundancy is applied to the transmission data that has a data size of 5000 bytes so that coded data of 8+2=10 are generated.

At that time, the size of each block data is 5000/8=625 bytes. If the size of a DDB in the data carousel system is 1000 bytes, only one block data can be contained in the DDB; therefore, the unused portion of 1000−625=375 bytes is generated in each DDB that has 1000 bytes. Because the total number of DDBs of the transmission data is 10, a total unused portion of 375×10=3750 bytes is generated in all of the DDBs of the transmission data.

The above-described problem is a common problem in data transmission technologies like the data carousel system in which data is divided and the divided data is contained in a transmission data block that has a predetermined size and is repeatedly transmitted during a predetermined period of time.

SUMMARY

According to an aspect of an embodiment of the invention, a data transmitting device includes a coded-data generating unit that divides transmission data by a predetermined number in accordance with a data size of the transmission data and then adds a redundant code to the divided transmission data at a predetermined ratio or adds the redundant code to the transmission data at the predetermined ratio so as to generate multiple blocks of coded data, and a data transmitting unit that groups together the multiple blocks of coded data generated by the coded-data generating unit into a number of blocks that are inserted into a transmission data block that has a predetermined size and then transmits the transmission data block.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 6 is a diagram that illustrates the comparison between the transmission of uncoded data by using the data carousel system and the transmission of coded data by using the data carousel system according to a third embodiment;

DESCRIPTION OF EMBODIMENTS

Preferred embodiments of the present invention will be explained with reference to accompanying drawings. However, the embodiment is not intended to restrict the disclosed technology.

First Embodiment

Figure 1:
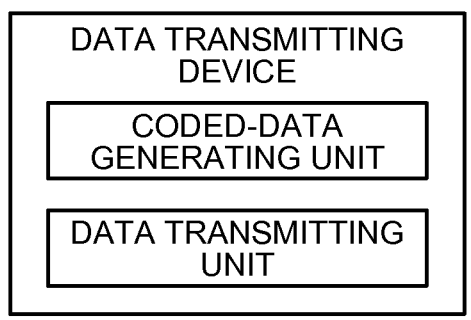
FIG. 1 is a diagram that illustrates a data transmitting device according to a first embodiment.

FIG. 1 is a diagram that illustrates a data transmitting device according to a first embodiment. As illustrated in the same figure, the data transmitting device according to the first embodiment includes a coded-data generating unit and a data transmitting unit. The coded-data generating unit divides transmission data by a predetermined number in accordance with a data size of the transmission data and then adds a redundant code to the divided transmission data at a predetermined ratio or adds the redundant code to the transmission data at the predetermined ratio so as to generate multiple blocks of coded data. The data transmitting unit groups together the multiple blocks of coded data generated by the coded-data generating unit into a number of blocks that can be inserted into a transmission data block, which has a predetermined size, and then transmits the transmission data block.

As described above, according to the first embodiment, the coded data is decoded on the receiver side of the data so that data missing from the received data can be restored. Furthermore, the transmission data is divided and then a redundant code is added to the divided transmission data at a predetermined ratio or a redundant code is added to undivided transmission data at a predetermined ratio; therefore, the size of each block of coded data can be controlled. Thus, it is possible to prevent a delay in the time the receiver side receives data and to reduce the unused portion of a transmission data block (DDB).

Second Embodiment

Configuration of Data Transmitting Device

Second Embodiment

Figure 2:
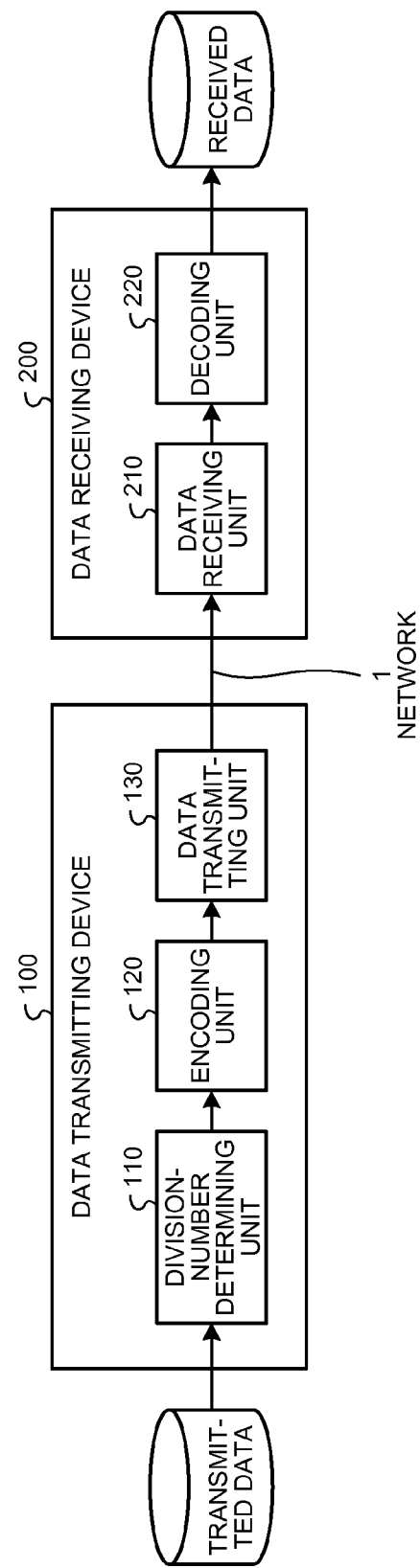
FIG. 2 is a diagram that illustrates the configuration of a data transmitting device according to a second embodiment.

FIG. 2 is a diagram that illustrates the configuration of a data transmitting device according to a second embodiment. As illustrated in the same figure, a data transmitting device 100 according to the second embodiment is connected to a data receiving device 200 via a network 1 such that they can communicate with each other. As illustrated in FIG. 2, the data transmitting device 100 includes a division-number determining unit 110, an encoding unit 120, and a data transmitting unit 130.

When receiving an input of transmission data via, for example, a data input unit, the division-number determining unit 110 determines the number by which the transmission data is to be divided in accordance with the data size of the transmission data and the redundancy coding ratio (fixed block data number:redundant data number). For example, the division-number determining unit 110 calculates the total of unused portions that are generated in transmission data blocks (DDB), which have a predetermined size, by increasing the number by which the transmission data is divided from 2 to 10 in increments of 1, where the data size of the transmission data and the current redundancy coding ratio are fixed. The division-number determining unit 110 then determines, as the number by which the transmission data is to be divided, the division number by which the unused portions are the least among the calculated total of unused portions that are generated in the transmission data blocks.

Figure 3:
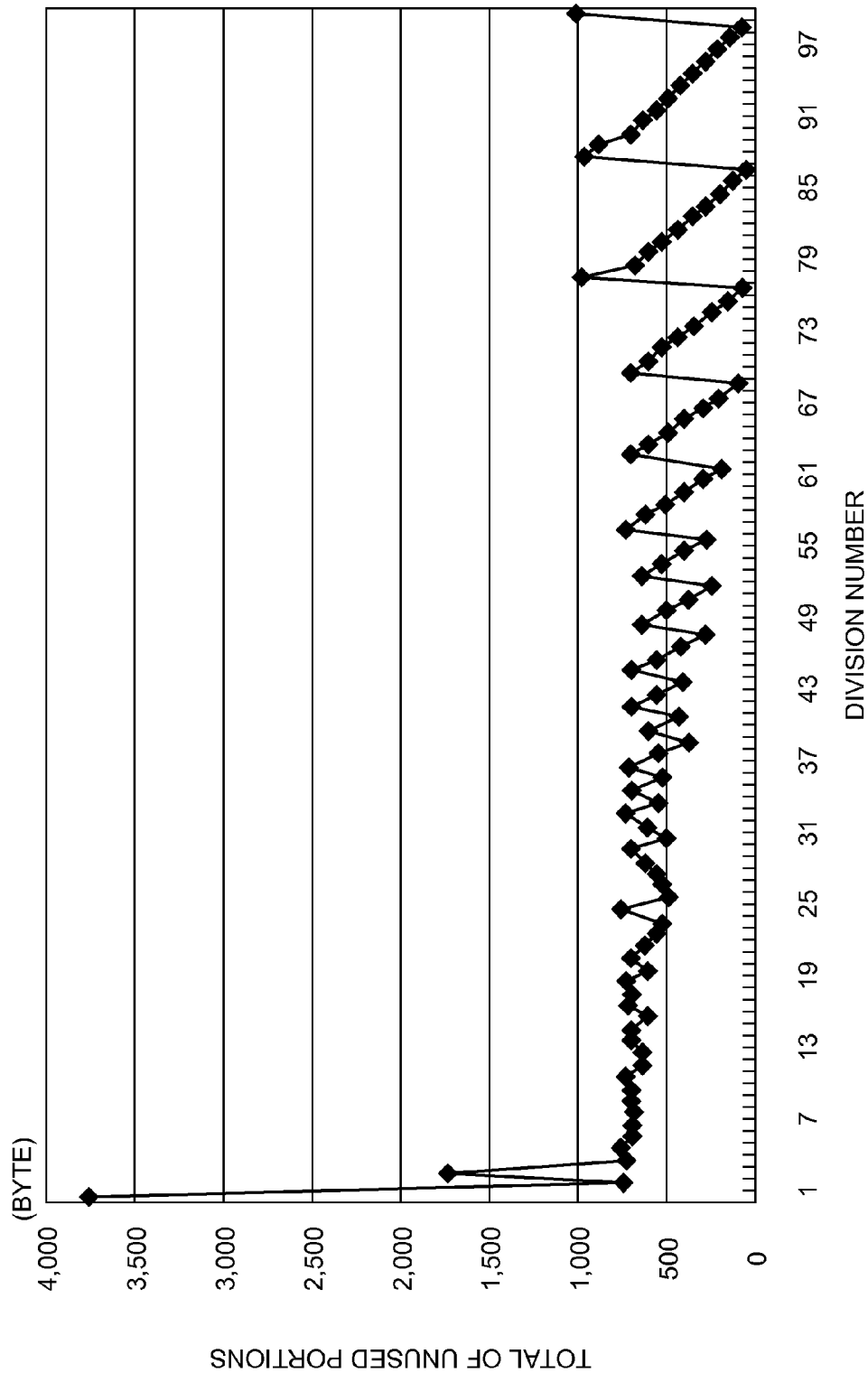
FIG. 3 is a graph that illustrates the relation between the number by which the transmission data is divided and the unused portions that are generated in the transmission data blocks according to the second embodiment.

For example, FIG. 3 illustrates the relation between the number by which the transmission data is divided and the unused portions that are generated in the transmission data blocks. As illustrated in the same figure, if the data size of the transmission data and the redundancy coding ratio are fixed, the unused portions that are generated in the transmission data blocks are almost the least when the division number is around 10. Thus, the division-number determining unit 110 calculates the total of unused portions that are generated in the transmission data blocks by changing the number by which the transmission data is divided from 2 to 10 in increments of 1 and then determines, as the number by which the transmission data is to be divided, the division number by which the calculated unused portions are the least among the division numbers from 2 to 10. Here, the unused portions that are generated in the transmission data blocks are the total of space areas that are generated in the transmission data blocks if multiple blocks of coded data are generated by adding a redundant code to the divided transmission data at a predetermined ratio and the multiple blocks of coded data are grouped together into a number of blocks that can be inserted into a transmission data block. FIG. 3 is a diagram that illustrates the relation between the number by which the transmission data is divided and the unused portions that are generated in the transmission data blocks according to the second embodiment.

Figure 4:
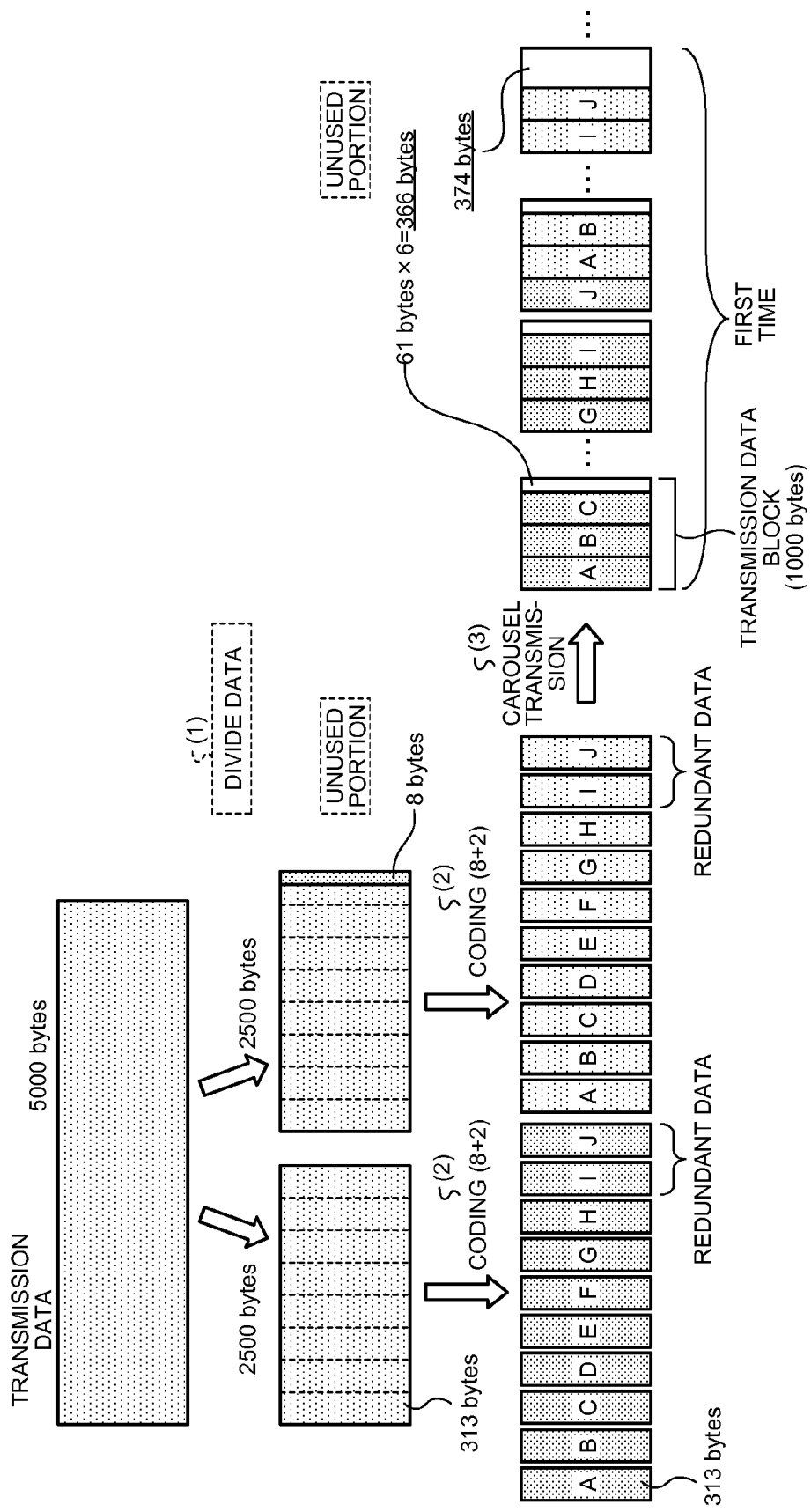
FIG. 4 is a diagram that illustrates the data flow according to the second embodiment.

The division-number determining unit 110 divides the transmission data by the determined division number. FIG. 4 illustrates the data flow according to the second embodiment. As illustrated in the same figure, if the division number "2" is determined, the division-number determining unit 110 divides the transmission data of "5000 bytes" into two data of "2500 bytes" (see (1) in the same figure).

The encoding unit 120 adds a redundant code to the transmission data divided by the division-number determining unit 110 at the current redundancy coding ratio so as to generate multiple blocks of coded data. For example, as illustrated in FIG. 4, the encoding unit 120 adds a redundant code to the divided transmission data (2500 bytes), which has been divided by the division-number determining unit 110, at the current redundancy coding ratio ("8 (fixed block data number)":"2 (redundant data number)") (see (2) in the same figure). If the encoding unit 120 separates the divided transmission data, which has been divided into 2500 bytes each, into eight uniformly-sized block data, a broken number is caused. Therefore, dummy data of 4 bytes is added to each divided transmission data, i.e., dummy data of 8 bytes is added in total, and multiple blocks of coded data (A to J) are generated from each divided transmission data, where each block data has "313 bytes".

The data transmitting unit 130 groups together the multiple blocks of coded data (e.g., A to J), which have been generated by the encoding unit 120, into a number of blocks that can be inserted into a transmission data block, which has a predetermined size, and then repeatedly transmits it by using a data carousel system. For example, as illustrated in FIG. 4, the data transmitting unit 130 groups together multiple blocks of coded data (A to J), which each have "313 bytes", into 3 blocks (e.g., A to C, . . . ), which is the number of blocks that can be inserted into a transmission data block that has a size of "1000 bytes", and then transmits the transmission data block.

As illustrated in FIG. 4, the total of the unused portions (space areas) in the transmission data blocks is 61×6=366 bytes. Thus, the data transmitting device 100 can reduce the unused portion of the data blocks, which are generated during one transmission by using the data carousel system, to 363+374=740 bytes in total. FIG. 4 is a diagram that illustrates the data flow according to the second embodiment.

As illustrated in FIG. 2, the data receiving device 200 includes a data receiving unit 210 and a data decoding unit 220. The data receiving unit 210 receives coded data that is transmitted from the data transmitting device 100. The data decoding unit 220 decodes the coded data received by the data receiving unit 210 so as to restore the data and then outputs the restored data as received data.

Process Performed by Data Transmitting Device

Second Embodiment

Figure 5:
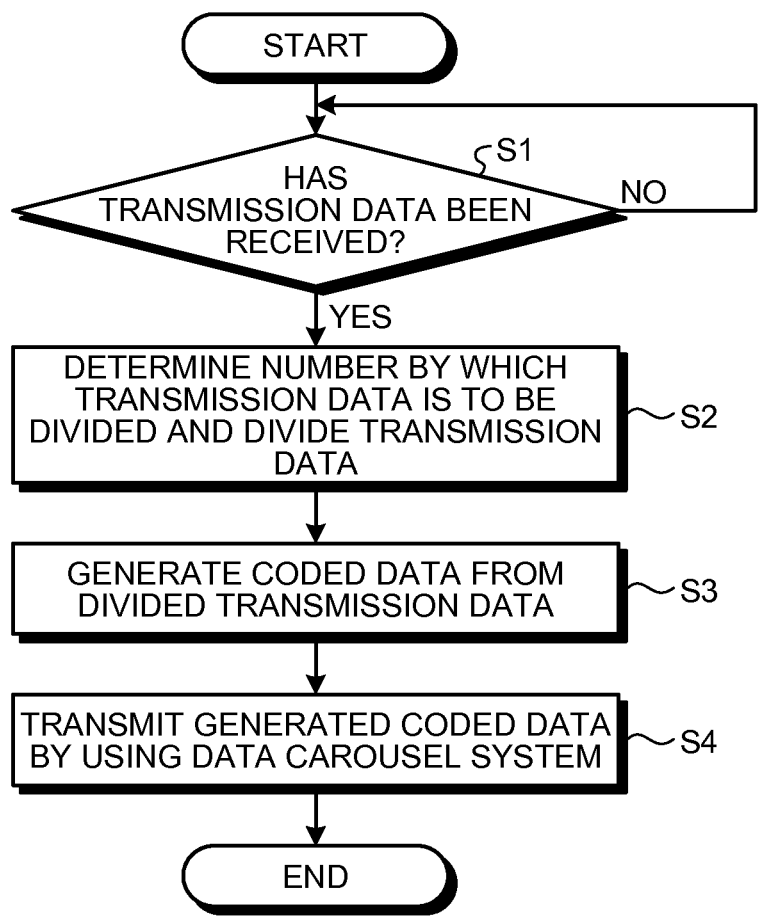
FIG. 5 is a chart that illustrates the flow of a process performed by the data transmitting device according to the second embodiment.

FIG. 5 is a chart that illustrates the flow of a process performed by the data transmitting device according to the second embodiment. As illustrated in the same figure, when receiving an input of transmission data (Yes at Step S1), the division-number determining unit 110 determines the number by which the transmission data is to be divided in accordance with the data size of the transmission data and the redundancy coding ratio and then divides the transmission data by the determined division number (Step S2).

The encoding unit 120 adds a redundant code to the transmission data, which has been divided by the division-number determining unit 110, at the current redundancy coding ratio so as to generate multiple blocks of coded data (Step S3). The data transmitting unit 130 groups together the multiple blocks of coded data (e.g., A to J), which have been generated by the encoding unit 120, into a number of blocks that can fit within the size of a transmission data block, which has a fixed size, and then transmits the transmission data block by using a data carousel system (Step S4).

As described above, the data transmitting device 100 divides transmission data by a predetermined number in accordance with the data size of the transmission data and then adds a redundant code to the data at a predetermined ratio. The data transmitting device 100 groups together multiple blocks of coded data, which are generated by the coded-data generating unit, into a number of blocks that can fit within the size of a transmission data block and then transmits the transmission data block. Therefore, the data transmitting device 100 can control the size of each block of coded data. Furthermore, the data receiving device 200 decodes the data received from the data transmitting device 100 so as to restore the data. Thus, according to the second embodiment, it is possible to prevent a delay in the time the receiver side receives data and to reduce the unused portion of transmission data blocks (DDB).

Third Embodiment

In the above-described embodiment, the data transmitting device 100 may encode one or more transmission data and control the transmission order of coded data when each coded data is transmitted to the data receiving device 200.

Configuration of Data Transmitting Device

Third Embodiment

The configuration of the data transmitting device according to a third embodiment is basically the same as that of the data transmitting device 100 according to the second embodiment; however, they are different in the way described below.

When receiving an input of multiple transmission data via, for example, a data input unit, the encoding unit 120 generates coded data at +100% redundancy from each transmission data. Here, +100% redundancy means redundancy coding by which the number of block data of the coded data is the same as that of redundant data thereof. If the same number of coded data as that of redundant data is provided, missing data can be restored.

When each coded data generated by the encoding unit 120 is to be transmitted, the data transmitting unit 130 first inserts a block data portion (e.g., a portion corresponding to A to H in FIG. 4) of one coded data into transmission data blocks. The data transmitting unit 130 then inserts a redundant portion (e.g., a portion corresponding to I, J in FIG. 4) of the same coded data into a transmission data block. In the same manner, a block data portion and a redundant portion of another coded data are inserted into transmission data blocks. The data transmitting unit 130 then transmits the transmission data blocks, into which each coded data is inserted, to the data receiving device 200 by using a data carousel system.

FIG. 6 illustrates the comparison between the transmission of uncoded data by using a data carousel system and the transmission of coded data by using the data carousel system. For example, as illustrated in the same figure, the data transmitting unit 130 inserts the block data portion of the coded data X, to which redundant codes are added at +100% redundancy, into transmission data blocks (DDB) 1 to 5, inserts the redundant portion thereof into transmission data blocks 6 to 10, and then transmits the transmission data blocks. In the same manner, the data transmitting unit 130 inserts the block data portion of the coded data Y, to which redundant codes are added at +100% redundancy, into transmission data blocks 1 to 4, inserts the redundant portion thereof into transmission data blocks 5 to 8, and then transmits the transmission data blocks. FIG. 6 is a diagram that illustrates the comparison between the transmission of uncoded data by using a data carousel system and the transmission of coded data by using the data carousel system according to the third embodiment.

Process Performed by Data Transmitting Device

Third Embodiment

Figure 7:
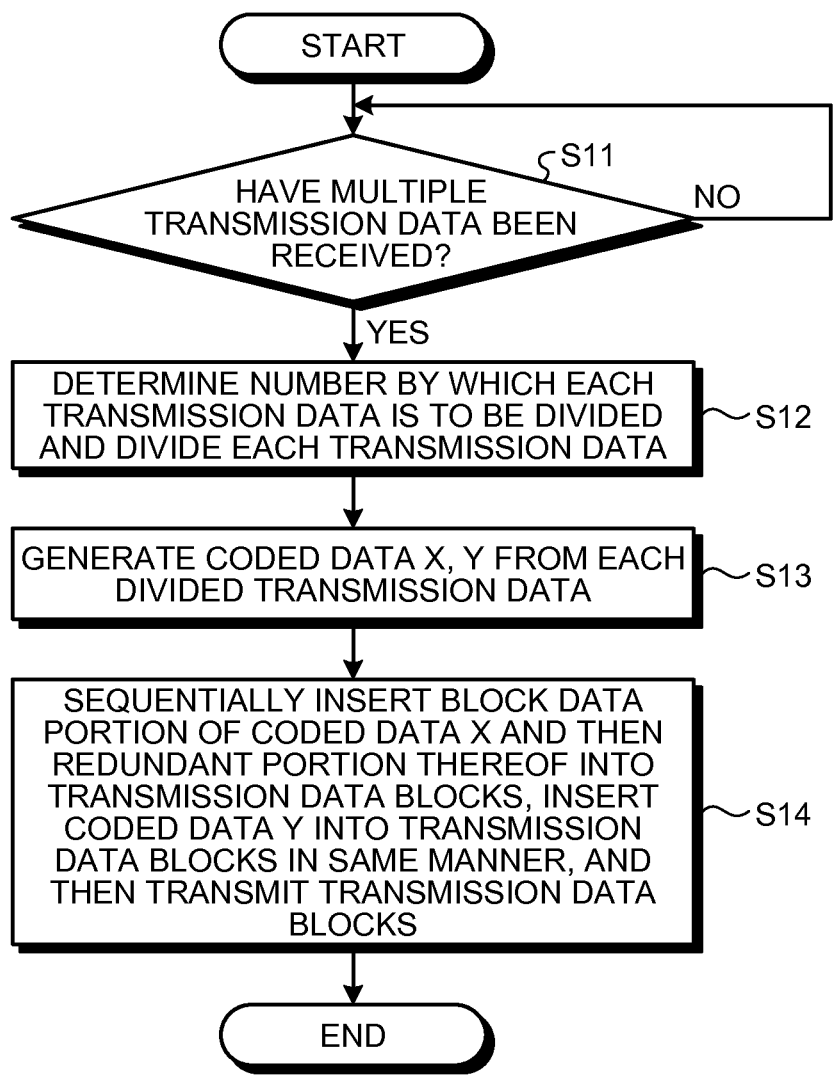
FIG. 7 is a chart that illustrates the flow of a process performed by a data transmitting device according to the third embodiment.

FIG. 7 is a chart that illustrates the flow of a process performed by the data transmitting device according to the third embodiment. As illustrated in the same figure, when receiving an input of multiple transmission data (Yes at Step S11), the division-number determining unit 110 determines the number by which each transmission data is to be divided in accordance with the data size of the transmission data and the redundancy coding ratio and then divides each transmission data by the determined division number (Step S12).

The encoding unit 120 adds redundant codes to the transmission data, which has been divided by the division-number determining unit 110, at the current redundancy coding ratio so as to generate coded data X and Y (Step S13). The data transmitting unit 130 sequentially inserts the block data portion of the coded data X, which has been generated by the encoding unit 120, and then the redundant portion thereof into transmission data blocks, inserts the coded data Y into transmission data blocks in the same manner, and then transmits the transmission data blocks (Step S14).

Figure 8:
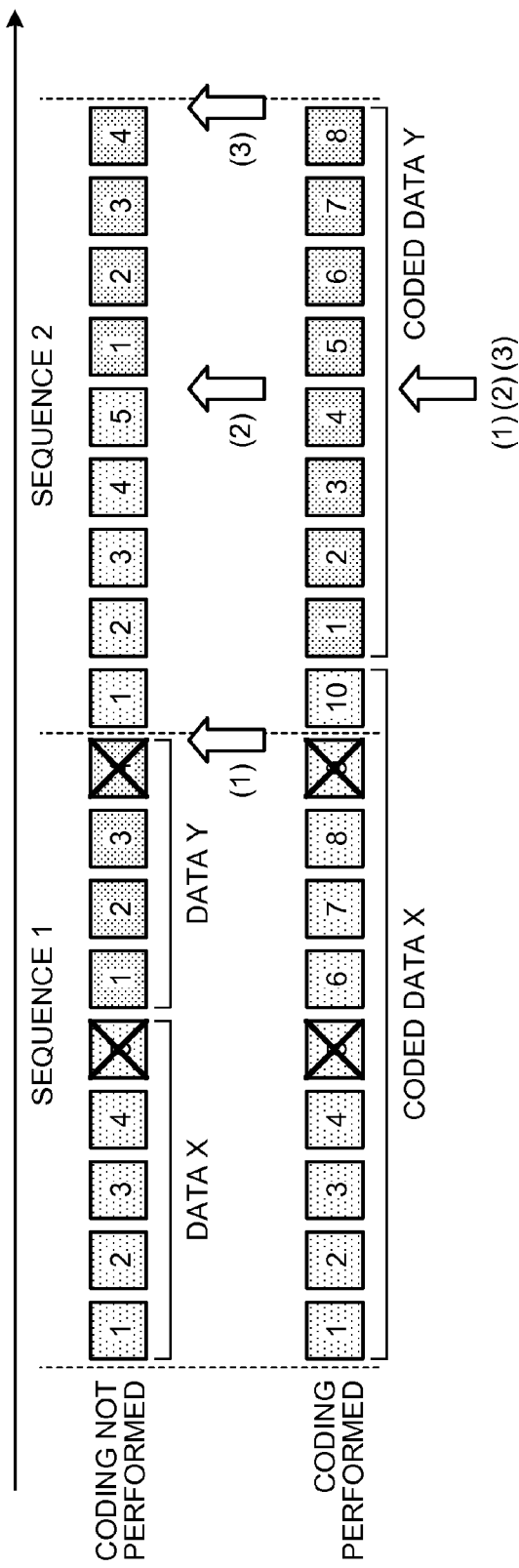
FIG. 8 is a diagram that illustrates the data transmission order and the times of data restoration according to the third embodiment.

FIG. 8 is a diagram that illustrates the data transmission order and the times of data restoration according to the third embodiment. The number (1) in the same figure indicates the time of data restoration performed by the data receiving device 200 with respect to coded data and uncoded data, if no portion is missing from the data received by the data receiving device 200. The number (2) in the same figure indicates the time of data restoration performed by the data receiving device 200 with respect to a case where the fifth uncoded transmission data is missing from the received data and a case where the fifth coded transmission data is missing from the received data. The number (3) in the same figure indicates the time of data restoration performed by the data receiving device 200 with respect to a case where the ninth uncoded transmission data is missing from the received data and a case where the ninth coded transmission data is missing from the received data.

As illustrated in (2) in the same figure, if the fifth data X and the fifth coded data X, which corresponds to the fifth data X, are missing from the received data, the time of data restoration performed by the data receiving device 200 is the same. Furthermore, as illustrated in (3) in the same figure, if the fourth date Y and the ninth coded data X, which corresponds to the fourth data Y, are missing from the received data, the time of data restoration performed by the data receiving device 200 is earlier in the case where the coded data is transmitted. As illustrated in (1) in the same figure, if no portion is missing from the data received by the data receiving device 200, the time of data restoration performed by the data receiving device 200 is earlier in the case where the transmission data is transmitted without being encoded.

As described above, according to the third embodiment, the block data portion of coded data is transmitted and followed by the redundant portion thereof so that, if any portion is missing from the received data, the restoration of the received data is not delayed more than that in a case where the transmission data is not encoded. Therefore, even if there is any loss in the received data, it is possible to prevent a delay in the time in which the receiver side receives data as much as possible.

Fourth Embodiment

In the above-described third embodiment, an explanation is given of a case where the data transmitting device 100 encodes multiple transmission data and sequentially transmits the block data portion of each coded data and then the redundant portion thereof; however, there is no limitation on this. For example, it is possible to sequentially transmit the block data portions of coded data and then the redundant portions of coded data.

Configuration of Data Transmitting Device

Fourth Embodiment

The configuration of a data transmitting device according to a fourth embodiment is different from that of the data transmitting device 100 according to the third embodiment in the way described below.

When each coded data generated by the encoding unit 120 is to be transmitted, the data transmitting unit 130 first inserts the block data portions of the coded data X, Y into transmission data blocks. The data transmitting unit 130 then inserts the redundant portions of the coded data X, Y into transmission data blocks. The data transmitting unit 130 then transmits the transmission data blocks, into which the coded data X, Y has been inserted, to the data receiving device 200 by using a data carousel system.

Process Performed by Data Transmitting Device

Fourth Embodiment

Figure 9:
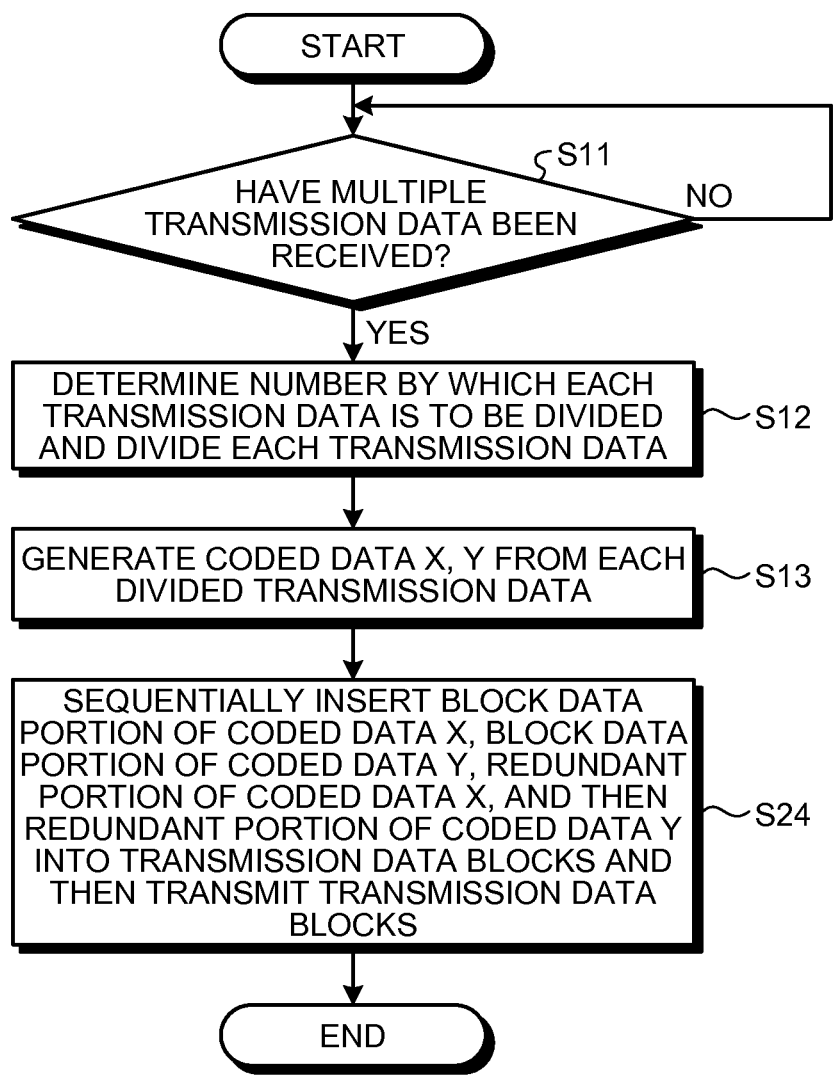
FIG. 9 is a chart that illustrates the flow of an operation performed by a data transmitting device according to a fourth embodiment.

FIG. 9 is a chart that illustrates the flow of an operation performed by the data transmitting device according to the fourth embodiment. As illustrated in the same figure, when receiving an input of multiple transmission data (Yes at Step S11), the division-number determining unit 110 determines the number by which each transmission data is to be divided in accordance with the data size of the transmission data and the redundancy coding ratio and then divides each transmission data by the determined division number (Step S12).

The encoding unit 120 adds redundant codes to the transmission data, which has been divided by the division-number determining unit 110, at the current redundancy coding ratio so as to generate coded data X and Y (Step S13). The data transmitting unit 130 sequentially inserts the block data portion of the coded data X generated by the encoding unit 120, the block data portion of the coded data Y, the redundant portion of the coded data X, and then the redundant portion of the coded data Y into transmission data blocks and then transmits the transmission data blocks (Step S24).

Figure 10:
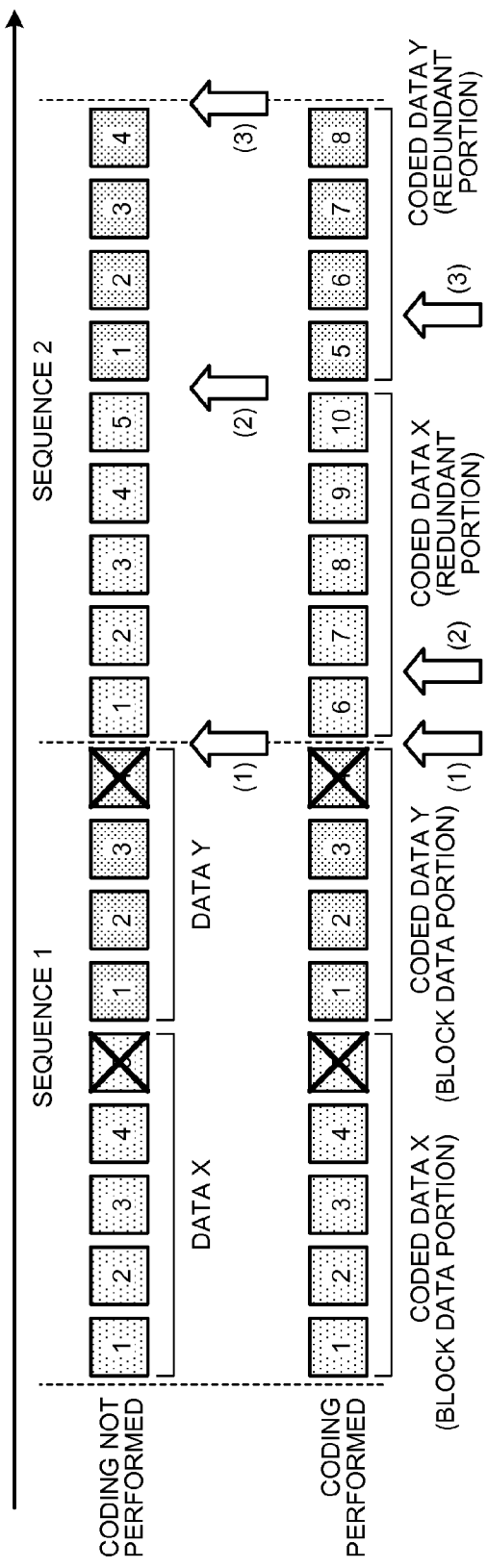
FIG. 10 is a diagram that illustrates the data transmission order and the times of data restoration according to the fourth embodiment.

FIG. 10 is a diagram that illustrates the data transmission order and the times of data restoration according to the fourth embodiment. The number (1) in the same figure indicates the time of data restoration performed by the data receiving device 200 with respect to coded data and uncoded data, if no portion is missing from the data received by the data receiving device 200. The number (2) in the same figure indicates the time of data restoration performed by the data receiving device 200 with respect to a case where the fifth uncoded transmission data is missing from the received data and a case where the fifth coded transmission data is missing from the received data. The number (3) in the same figure indicates the time of data restoration performed by the data receiving device 200 with respect to a case where the ninth uncoded transmission data is missing from the received data and a case where the ninth coded transmission data is missing from the received data.

As illustrated in (1) in the same figure, if no portion is missing from the data received by the data receiving device 200, the time of data restoration performed by the data receiving device 200 is the same. Furthermore, as illustrated in (2) in the same figure, if the fifth data X and the fifth coded data X, which corresponds to the fifth data X, are missing from the received data, the time of data restoration performed by the data receiving device 200 is earlier in a case where the coded data is transmitted. Moreover, as illustrated in (3) in the same figure, if the fourth data Y (the ninth uncoded data) and the fourth coded data Y (the ninth coded data), which corresponds to the fourth data Y, are missing from the received data, the following result can be obtained. That is, the time of data restoration performed by the data receiving device 200 is earlier in a case where the coded data is transmitted.

As described above, according to the fourth embodiment, the block data portions of coded data and the redundant portions thereof are sequentially transmitted so that, regardless of whether any portion is missing from received data, it is often the case that the received data can be restored earlier than if the transmission data is not encoded. Thus, it is possible to prevent a delay in the time in which the receiver side receives data and to often make the time in which the received data is restored earlier than if the transmission data is not encoded.

Fifth Embodiment

Not only the time in which coded data is transmitted is controlled, as described in the third embodiment and the fourth embodiment, but also each block of the coded data X, Y may be alternately inserted into transmission data blocks and then transmitted.

Configuration of Data Transmitting Device

Fifth Embodiment

The configuration of the data transmitting device according to the fifth embodiment is different from that of the data transmitting device 100 according to the third embodiment in the way described below.

When each coded data generated by the encoding unit 120 is to be transmitted, the data transmitting unit 130 first inserts each block of the coded data X (each block of the block data portion and the redundant portion) into a transmission data block. The data transmitting unit 130 then inserts each block of the coded data Y into a transmission data block. Until the entire coded data X, Y is inserted into transmission data blocks, each block of the coded data X, Y is alternately inserted into a transmission data block and then transmitted to the data receiving device 200 by using the data carousel system.

Process Performed by Data Transmitting Device

Fifth Embodiment

Figure 11:
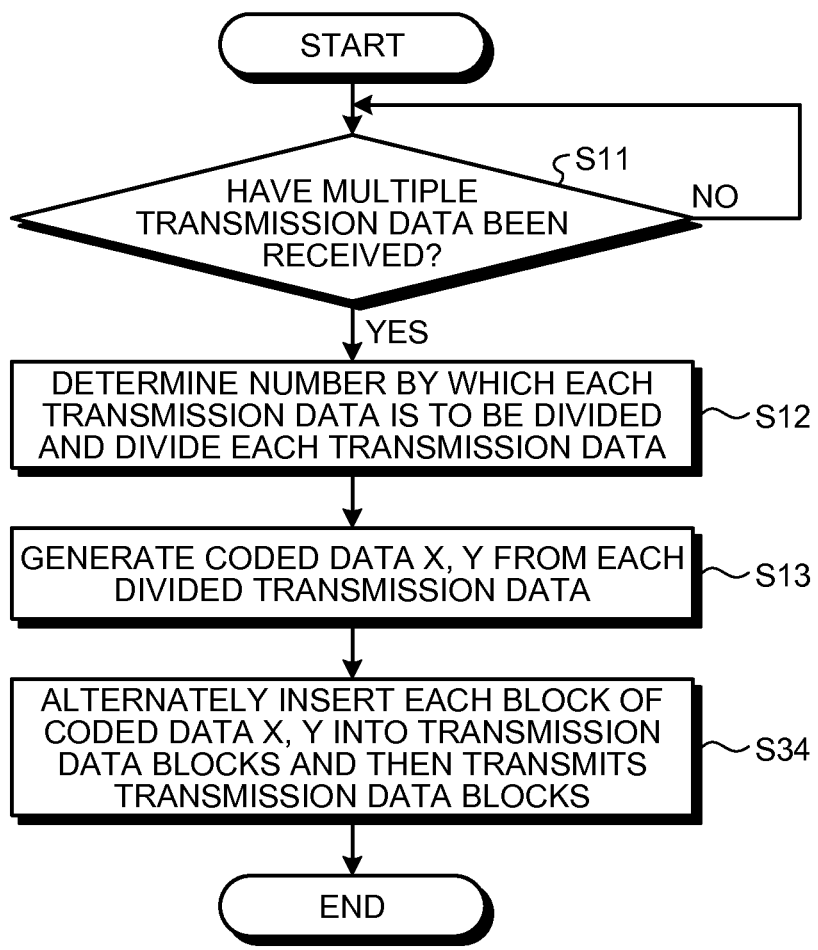
FIG. 11 is a chart that illustrates the flow of a process performed by a data transmitting device according to a fifth embodiment.

FIG. 11 is a chart that illustrates the flow of a process performed by a data transmitting device according to a fifth embodiment. As illustrated in the same figure, when receiving an input of multiple transmission data (Yes at Step S11), the division-number determining unit 110 determines the number by which each transmission data is to be divided in accordance with the data size of the transmission data and the redundancy coding ratio and then divides each transmission data by the determined division number (Step S12).

The encoding unit 120 adds redundant codes to the transmission data, which has been divided by the division-number determining unit 110, at the current redundancy coding ratio so as to generate coded data X and Y (Step S13). The data transmitting unit 130 alternately inserts each block of the coded data X, Y, which have been generated by the encoding unit 120, into transmission data blocks and then transmits the transmission data blocks (Step S34).

Figure 12:
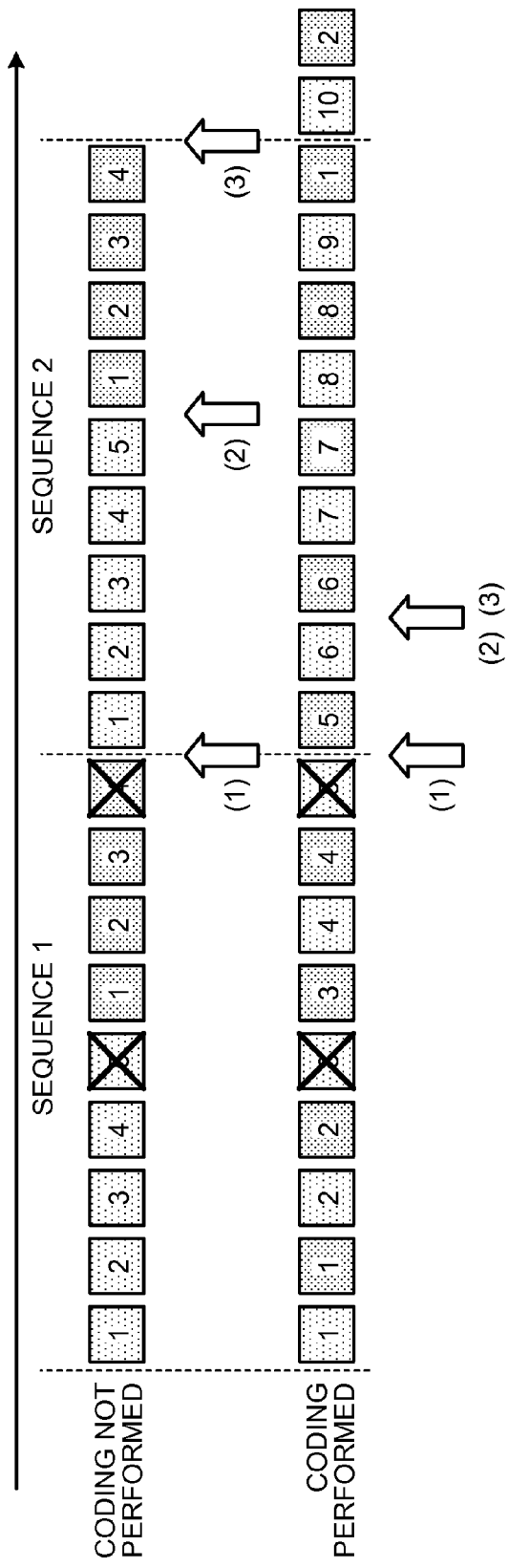
FIG. 12 is a diagram that illustrates the data transmission order and the times of data restoration according to the fifth embodiment.

FIG. 12 is a diagram that illustrates the data transmission order and the times of data restoration according to the fifth embodiment. The number (1) in the same figure indicates the time of data restoration performed by the data receiving device 200 with respect to coded data and uncoded data, if no portion is missing from the data received by the data receiving device 200. The number (2) in the same figure indicates the time of data restoration performed by the data receiving device 200 with respect to a case where the fifth uncoded transmission data is missing from the received data and a case where the fifth coded transmission data is missing from the received data. The number (3) in the same figure indicates the time of data restoration performed by the data receiving device 200 with respect to a case where the ninth uncoded transmission data is missing from the received data and a case where the ninth coded transmission data is missing from the received data.

As illustrated in (1) in the same figure, if no portion is missing from the data received by the data receiving device 200, the time of data restoration performed by the data receiving device 200 is the same. As illustrated in (2) in the same figure, if the fifth uncoded transmission data and the fifth coded transmission data, which corresponds to the above data, are missing from the received data, the time of data restoration performed by the data receiving device 200 is earlier in a case where the coded data is transmitted. Moreover, as illustrated in (3) in the same figure, if the ninth uncoded transmission data and the ninth coded data, which corresponds to the above data, are missing from the received data, the time of data restoration performed by the data receiving device 200 is earlier in a case where the coded data is transmitted.

As described above, according to the fifth embodiment, each block of each coded data is alternately inserted into transmission data blocks and then the transmission data blocks are transmitted so that, regardless of whether any portion is missing from received data, it is often the case that the received data can be restored earlier than if the transmission data is not encoded. Thus, it is possible to prevent a delay in the time in which the receiver side receives data and to often make the time in which the received data is restored earlier than if transmission data is not encoded.

Sixth Embodiment

An explanation is given below of another embodiment of a data transmitting device, a data generation program, and a data transmitting/receiving method that are disclosed in the subject application.

(1) Generation of Coded Data at Changed Redundancy Coding Ratio

In the above-described second embodiment, an explanation is given of a case where the data transmitting device 100 performs the following process to generate coded data. Specifically, in accordance with the data size of transmission data, the data transmitting device 100 determines a division number by which the difference between the size of a transmission data block and the total size of coded data in multiple blocks inserted into the transmission data block is the least. That is, a division number is determined by which the unused portion of a transmission data block is the least. The data transmitting device 100 divides the transmission data by the determined division number and then adds redundant codes to the data at a predetermined redundancy coding ratio so as to generate multiple blocks of coded data.

The data transmitting device 100 may perform not only the process described above in the second embodiment but it may also perform the following process to generate coded data. For example, in accordance with the data size of transmission data, the data transmitting device 100 obtains a redundancy coding ratio by which the difference between the size of a transmission data block and the total size of coded data in multiple blocks inserted into the transmission data block is the least. That is, a redundancy coding ratio is obtained by which the unused portion of a transmission data block is the least. The data transmitting device 100 then adds redundant codes to the transmission data at the obtained redundancy coding ratio so as to generate coded data.

Figure 13:
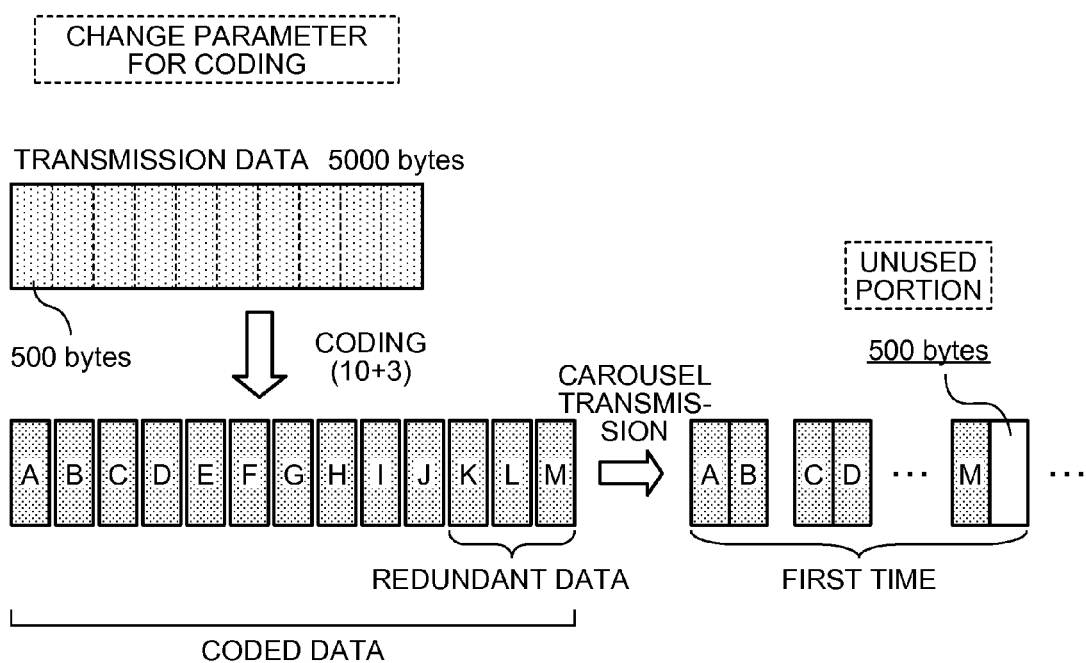
FIG. 13 is a diagram that illustrates the data flow when the redundancy coding ratio is changed according to a sixth embodiment.

For example, as illustrated in FIG. 13, the redundancy coding ratio "10+3 (fixed block data number 10:redundant data number 3)" is obtained, by which the unused portion of transmission data blocks is the least if coded data is generated from transmission data of 5000 bytes and the coded data is inserted into transmission data blocks. In this case, if 13 blocks of coded data are generated from the transmission data and if each block of the generated coded data is inserted into transmission data blocks to the extent possible, the unused portion of the transmission data blocks is 500 bytes. In the above-described second embodiment, the unused portion of the transmission data blocks is 740 bytes: therefore, it is possible to further reduce the unused portion of transmission data blocks than that in the above-described second embodiment. FIG. 13 is a diagram that illustrates the data flow when the redundancy coding ratio is changed according to the sixth embodiment.

Although FIG. 13 illustrates a case where two blocks of coded data are inserted into a transmission data block, as described above, there is no limitation on this. For example, within a range where the purpose of reducing as much of the unused portion of a transmission data block as possible is met, the redundancy coding ratio may be changed so that one block of coded data is inserted into a transmission data block.

Furthermore, both a division number and a redundancy coding ratio, by which the unused portion of a transmission data block is the least, may be obtained and coded data may be generated from transmission data by using the obtained division number and redundancy coding ratio.

(2) Example of Control of Order in which Multiple Coded Data are Transmitted

The data transmitting device 100 does not only control the order in which coded data are transmitted, as described above in the third to fifth embodiments. For example, the data transmitting device 100 may allocate several blocks of data included in each coded data into multiple groups of blocks, sequentially insert the allocated groups of blocks into transmission data blocks, and then transmit the transmission data blocks.

Figure 14:
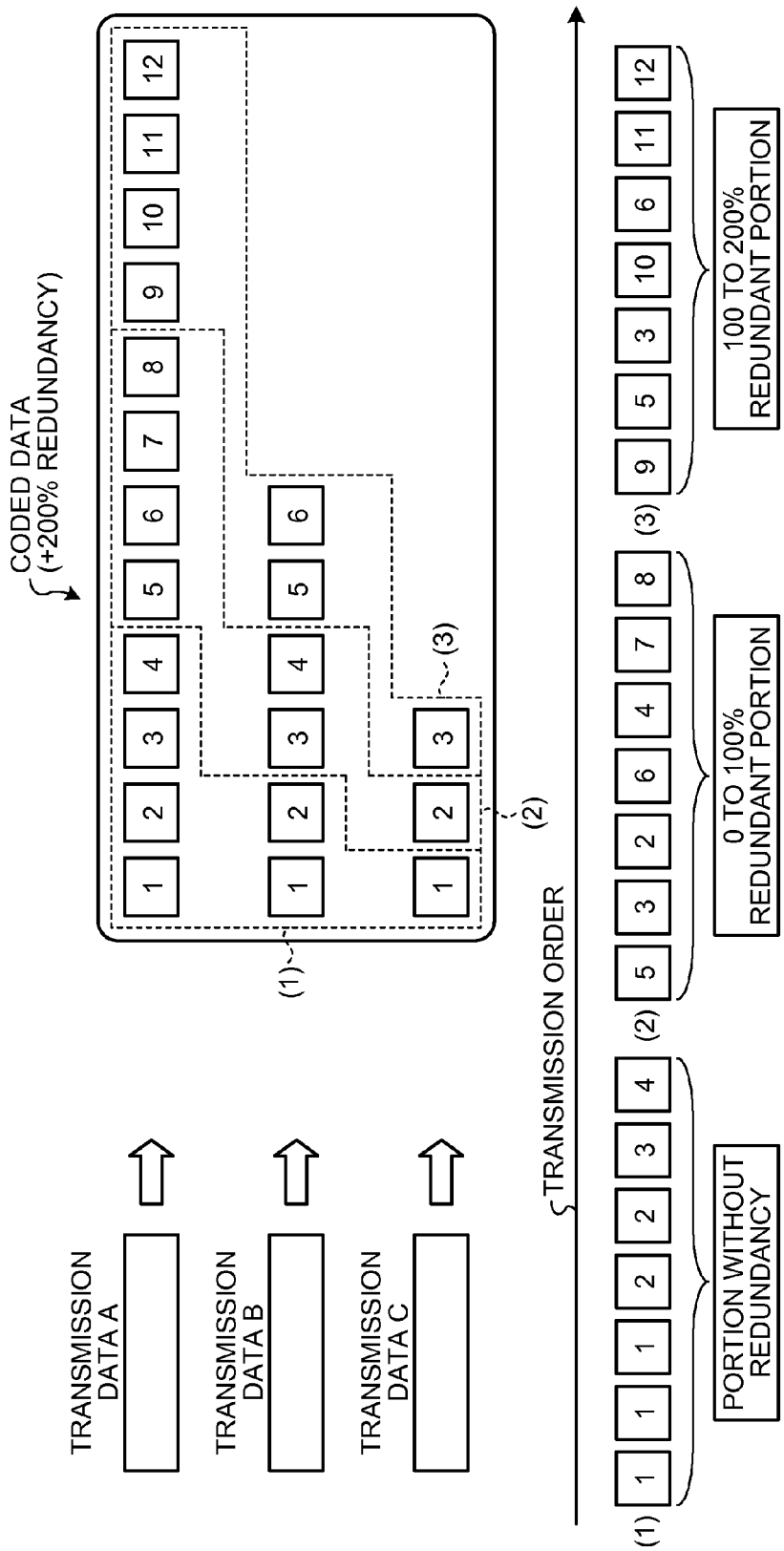
FIG. 14 is a diagram that illustrates an example of the transmission order in which several blocks of data included in each coded data are allocated.

For example, FIG. 14 illustrates an example of the transmission order in which several blocks of data included in each coded data are allocated. The same figure illustrates a case where coded data is generated from each transmission data A to C with "+200% redundancy". The data transmitting device 100 allocates blocks of each coded data generated from the transmission data A to C to each group for a portion other than redundant portions, for a 0 to 100% redundant portion, and for a 100 to 200% redundant portion, sequentially inserts each group into transmission data blocks, and transmits the transmission data blocks. FIG. 14 is a diagram that illustrates an example of the transmission order in which several blocks of data included in each coded data are allocated.

As illustrated in FIG. 14, allocation is performed so that, for example, the blocks 1 to 4 of the coded data generated from the transmission data A, the blocks 1 and 2 of the coded data generated from the transmission data B, and the block 1 of the coded data generated from the transmission data C belong to one group. In the same manner, allocation is performed so that the blocks 5 to 8 of the coded data generated from the transmission data A, the blocks 3 and 4 of the coded data generated from the transmission data B, and the block 2 of the coded data generated from the transmission data C belong to one group. In the same manner, allocation is performed so that the blocks 9 to 12 of the coded data generated from the transmission data A, the blocks 5 and 6 of the coded data generated from the transmission data B, and the block 3 of the coded data generated from the transmission data C belong to one group. The data transmitting device 100 sequentially inserts each group, which has several blocks of each coded data, into transmission data blocks and then transmits the transmission data blocks.

(3) Compression of Header of Coded Data

Moreover, the data transmitting device 100 may insert, into the same header, information (a block number, coded bit string) on coded data, which are inserted into the same transmission data block, so that the header added to each coded data is compressed.

Figure 15:
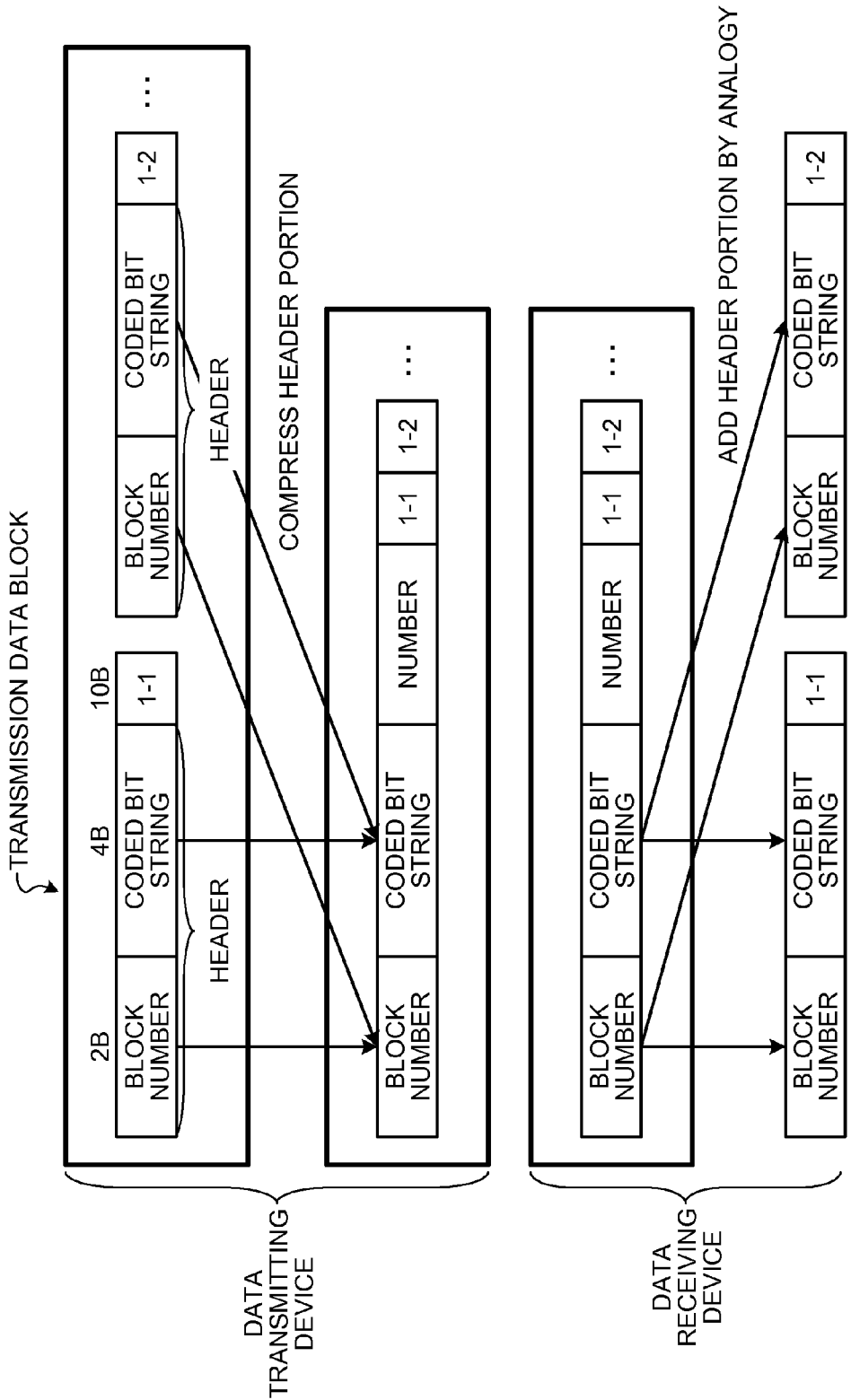
FIG. 15 is a diagram that illustrates an example of compression of the header according to the sixth embodiment.

For example, as illustrated in FIG. 15, the data transmitting device 100 prepares only one header each for the same transmission data block. The same header contains the block number (information for uniquely identifying a block) of each block inserted into the same transmission data block, a coded bit string (information for uniquely identifying the coded data in a block), and the number that represents the number of blocks in a transmission block. Thus, it is possible to compress the header of a transmission data block and to prevent a problem in that, when the size of coded data becomes small, the size of the header becomes significantly large.

Moreover, the data receiving device 200 extracts information on the block number, the coded bit string, and the number from the header portion of the transmission data block received from the data transmitting device 100. The data receiving device 200 then decodes the coded data by relating the block inserted into the transmission data block to the block number and the coded bit string so as to restore the data. FIG. 15 is a diagram that illustrates an example of compression of the header according to the sixth embodiment.

(4) Configuration of Device, and the Like

Each of the components of the data transmitting device 100 depicted in, for example, FIG. 2 is based on a functional concept and does not necessarily need to be physically configured as illustrated in the drawings. Specifically, specific forms of separation and combination of the data transmitting device 100 are not limited to those depicted in the drawings. For example, the division-number determining unit 110 and the encoding unit 120 are functionally or physically combined. Thus, it is possible that all or some of the data transmitting device 100 may be functionally or physically separated or combined in an arbitrary unit depending on various types of loads or usage.

(5) Data Transmission Program

Figure 16:
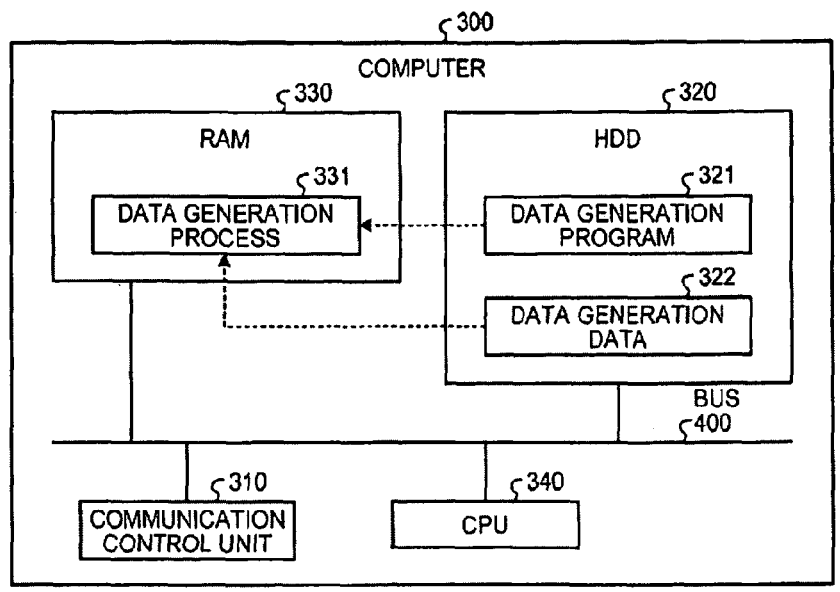
FIG. 16 is a diagram that illustrates a computer that executes a data transmission program.
Figure 17:
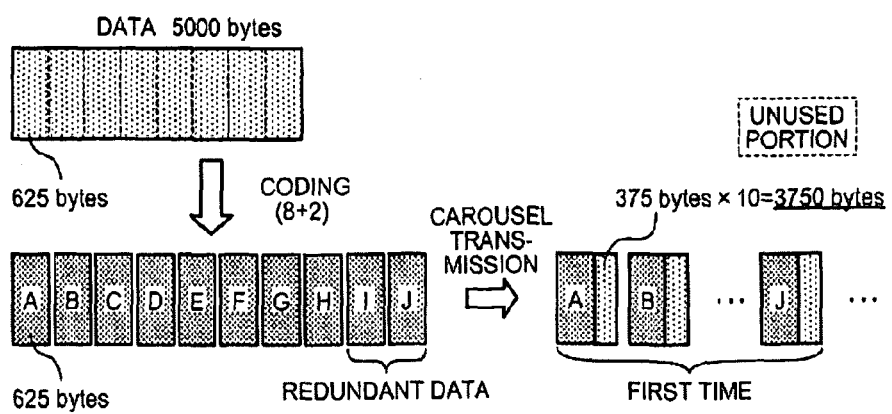
FIG. 17 is a diagram that illustrates the problem with the conventional technology.

For example, various types of processing (see, for example, FIGS. 7, 9, 11) performed by the data transmitting device 100 that is described above in the embodiments may be performed by a computer system, such as a personal computer or workstation, that executes prepared programs. With reference to FIG. 16, an explanation is given below of an exemplary computer that executes a data transmission program that has the same function as the data transmitting device 100 described above in the embodiments. FIG. 16 is a diagram that illustrates a computer that executes the data transmission program.

As illustrated in the same figure, a computer 300 is configured as a data transmitting device, where a communication control unit 310, an HDD 320, an RAM 330, and a CPU 340 are connected to one another via a bus 400.

The communication control unit 310 controls communication for transferring various types of information. The HDD 320 stores therein information for the CPU 340 to perform various processes. The RAM 330 temporarily stores therein various types of information. The CPU 340 performs various calculation operations.

As illustrated in FIG. 16, the HDD 320 pre-stores therein, for example, a data generation program 321 that performs the same function as each processing unit of the data transmitting device 100 illustrated in FIG. 2 and stores therein data generation data 322. The data generation program 321 may be distributed as appropriate and stored in a storage unit of a different computer that is connected via a network so as to perform communication therebetween.

The CPU 340 reads the data generation program 321 from the HDD 320 and loads it into the RAM 330 so that the data generation program 321 functions as a data generation process 331, as illustrated in FIG. 16.

Specifically, the data generation process 331 reads the data generation data 322, or the like, from the HDD 320, loads it into an area allocated to the data generation process 331 in the RAM 330, and performs various processes in accordance with the loaded data, or the like.

The data generation process 331 corresponds to, for example, a process performed by each processing unit of the data transmitting device 100 illustrated in FIG. 2. Particularly, it corresponds to a process performed by the division-number determining unit 110 and the encoding unit 120, as illustrated in FIG. 2.

The above-described data generation program 321 does not always need to be initially stored in the HDD 320.

For example, each program is stored in a "portable physical medium", such as a flexible disk (FD), a CD-ROM, a DVD disk, a magneto-optical disk, or an IC card, that is inserted into, for example, the computer 300. The computer 300 may read each program from it and execute the program.

Moreover, each program is stored in "another computer (or server)", or the like, that is connected to the computer 300 via a public line, the Internet, a LAN, a WAN, or the like. The computer 300 may read each program from it and execute the program.

Each of the above-described embodiments can be also used in data transmission technologies in which, as with the data carousel system, data is divided, the divided data is contained in a data block that has a predetermined size, and the data is repeatedly transmitted during a predetermined period of time.

One aspect of a data transmitting device, a data generation program, and a data transmitting/receiving method disclosed in the present application has an effect of preventing a delay in the time when a receiver side receives data and reducing the unused portion of a DDB.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A data transmitting device comprising:
    a coded-data generating unit that divides transmission data by a predetermined number in accordance with a data size of the transmission data and then adds a redundant code to the divided transmission data at a predetermined ratio or adds the redundant code to the transmission data at the predetermined ratio so as to generate multiple blocks of coded data; and
    a data transmitting unit that groups together the multiple blocks of coded data generated by the coded-data generating unit into a number of blocks that are inserted into a transmission data block that has a predetermined size and then transmits the transmission data block, wherein
    the coded-data generating unit determines, in accordance with the data size of the transmission data, the predetermined number and/or the predetermined ratio based on a difference between the predetermined size of the transmission data block and a total of sizes of the multiple blocks of coded data inserted into the transmission data block.

2. The data transmitting device according to claim 1, wherein
    the coded-data generating unit generates, with respect to one or more transmission data, the coded data for each transmission data, and
    the data transmitting unit sequentially inserts, into the transmission data block, from the coded data that corresponds to a first data out of the transmission data, a block of a portion other than a redundant portion and then inserts a block of the redundant portion; sequentially inserts, into the transmission data block, from the coded data that corresponds to a second data out of the transmission data, a block of a portion other than a redundant portion and then inserts a block of the redundant portion; inserts third and subsequent data into transmission data blocks in the same manner; and then transmits the transmission data block.

3. The data transmitting device according to claim 1, wherein the data transmitting unit sequentially inserts, into the transmission data block, from the coded data that corresponds to the first data, the block of the portion other than the redundant portion and then inserts, from the coded data that corresponds to the second data, the block of the portion other than the redundant portion so as to insert, for every transmission data, from the coded data that corresponds thereto, the block of the portion other than the redundant portion; and sequentially inserts, into the transmission data block, from the coded data that corresponds to the first data, the block of the redundant portion and then inserts, from the coded data that corresponds to the second data, the block of the redundant portion so as to insert, for every transmission data, from the coded data that corresponds thereto, the block of the redundant portion; and then transmits the transmission data block.

4. The data transmitting device according to claim 1, wherein the data transmitting unit sequentially inserts, into the transmission data block, one block from the coded data that corresponds to the first data and then inserts one block from the coded data that corresponds to the second data so as to insert, for every transmission data, the block from the coded data that correspond thereto; and then transmits the transmission data block.

5. The data transmitting device according to claim 2, wherein
the coded-data generating unit generates the coded data with respect to the third data, fourth data, and fifth data, and
the data transmitting unit allocates the coded data corresponding to the third data, the coded data corresponding to the fourth data, and the coded data corresponding to the fifth data to multiple block groups that each have several blocks of the coded data corresponding to the third data, several blocks of the coded data corresponding to the fourth data, and several blocks of the coded data corresponding to the fifth data; sequentially inserts the allocated multiple block groups into the transmission data block; and then transmits the transmission data block.

6. The data transmitting device according to claim 1, wherein, when the coded data generated by the coded-data generating unit is to be transmitted, the data transmitting unit inserts information for uniquely identifying a block that is a minimum unit of the coded data, inserts information for identifying the coded data in the block that is the minimum unit, and inserts information on the number of blocks of the coded data inserted into the transmission data block into a same header with respect to the coded data that is inserted into the same transmission data block.

7. A non-transitory computer-readable medium storing data generation program that causes a computer to execute a procedure comprising:
determining, in accordance with a data size of transmission data, a predetermined number and/or a predetermined ratio based on a difference between a predetermined size of a transmission data block and a total of sizes of multiple blocks of coded data inserted into the transmission data block; and
dividing the transmission data by the predetermined number and then adding a redundant code to the divided transmission data at the predetermined ratio or adding the redundant code to the transmission data at the predetermined ratio so as to generate the multiple blocks of coded data.

8. A data transmitting/receiving method performed by a transmitting device that transmits data and a receiving device that receives data transmitted from the transmitting device,
in the transmitting device
determining, in accordance with a data size of transmission data, a predetermined number and/or a predetermined ratio based on a difference between a predetermined size of a transmission data block and a total of sizes of multiple blocks of coded data inserted into the transmission data block;
dividing the transmission data by the predetermined number and then adding a redundant code to the divided transmission data at the predetermined ratio or adding the redundant code to the transmission data at the predetermined ratio so as to generate the multiple blocks of coded data; and
grouping together the multiple blocks of coded data into a number of blocks that are inserted into a transmission data block that has a predetermined size and then transmitting the transmission data block, and
in the receiving device
receiving the coded data that is transmitted by the data transmitting device using the transmission data block that has the predetermined size; and
decoding the received coded data.

9. A data transmitting device comprising:
a memory; and
a processor coupled to the memory, wherein the processor executes a process comprising:
determining, in accordance with a data size of transmission data, a predetermined number and/or a predetermined ratio based on a difference between a predetermined size of a transmission data block and a total of sizes of multiple blocks of coded data inserted into the transmission data block;
dividing the transmission data by the predetermined number and then adding a redundant code to the divided transmission data at the predetermined ratio or adding the redundant code to the transmission data at the predetermined ratio so as to generate the multiple blocks of coded data; and
grouping together the multiple blocks of coded data into a number of blocks that are inserted into a transmission data block that has a predetermined size and then transmitting the transmission data block.

* * * * *